(12) United States Patent
Kim (10) Patent No.: US 7,663,946 B2
(45) Date of Patent: Feb. 16, 2010

(54) SEMICONDUCTOR MEMORY DEVICE HAVING ON-DIE-TERMINATION DEVICE AND OPERATION METHOD THEREOF

(75) Inventor: Kyung-Whan Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 170 days.

(21) Appl. No.: 12/005,671

(22) Filed: Dec. 28, 2007

(65) Prior Publication Data

US 2009/0016124 A1  Jan. 15, 2009

(30) Foreign Application Priority Data

Jul. 12, 2007  (KR) ............... 10-2007-0070052

(51) Int. Cl.
*G11C 7/00* (2006.01)
(52) U.S. Cl. .................. 365/194; 365/229; 365/230.08
(58) Field of Classification Search ............... 365/194, 365/191, 189.05, 230.06, 229, 230.08
See application file for complete search history.

(56) References Cited

U.S. PATENT DOCUMENTS

| | | | |
|---|---|---|---|
| 6,047,346 A * | 4/2000 | Lau et al. ............... | 327/158 |
| 6,577,554 B2 * | 6/2003 | Song et al. .............. | 365/233.17 |
| 6,928,007 B2 * | 8/2005 | Jin ....................... | 365/194 |
| 7,019,555 B2 | 3/2006 | Lee | |
| 7,034,567 B2 | 4/2006 | Jang | |
| 7,342,412 B2 * | 3/2008 | Kim ..................... | 326/30 |
| 7,404,018 B2 * | 7/2008 | Dietrich et al. ........... | 710/52 |
| 7,474,572 B2 * | 1/2009 | Lee et al. ................ | 365/194 |
| 2005/0180229 A1 | 8/2005 | Jin | |
| 2005/0268059 A1 | 12/2005 | LaBerge | |
| 2009/0222637 A1 * | 9/2009 | Kim ..................... | 711/167 |

FOREIGN PATENT DOCUMENTS

| | | |
|---|---|---|
| JP | 2004-310981 | 11/2004 |
| JP | 2005-228458 | 8/2005 |
| KR | 10-2005-0104225 A | 11/2005 |
| KR | 10-2006-0089357 A | 8/2006 |

* cited by examiner

*Primary Examiner*—Tuan T Nguyen
*Assistant Examiner*—Hien N Nguyen
(74) *Attorney, Agent, or Firm*—Blakely, Sokoloff, Taylor & Zafman (57) ABSTRACT

A semiconductor memory device is capable of stably securing an on-die-termination (ODT) latency in spite of PVT variations and various operating speeds. The semiconductor memory device includes a plurality of termination resistors connected to an output pad in series and parallel, a drive controller, a delay path, and a delay control signal generator. The drive controller activates/inactivates the plurality of termination resistors in response to a driving control signal. The delay path delays a termination command by a delay time corresponding to an on-die-termination (ODT) latency to output the driving control signal, wherein the termination command is converted into a delay locked loop (DLL) clock domain signal. The delay control signal generator controls a conversion point of the termination command into the DLL clock domain signal.

24 Claims, 7 Drawing Sheets

SEMICONDUCTOR MEMORY DEVICE HAVING ON-DIE-TERMINATION DEVICE AND OPERATION METHOD THEREOF

CROSS-REFERENCE TO RELATED APPLICATIONS

The present invention claims priority to Korean patent application number 10-2007-0070052, filed on Jul. 12, 2007, which is incorporated by reference in its entirety.

BACKGROUND OF THE INVENTION

The present invention relates to semiconductor design technology, and more particularly to a semiconductor memory device having an on-die-termination device.

Generally, many new concepts have been proposed to rapidly control data transmission rate in double data rate (DDR) memory devices. Among the various concepts, the use of a termination resistor makes the memory device easily transmit signals with external devices.

However, if a resistance matching between the devices is not proper, a transmission signal may be reflected, thus leading to an error in signal transmission. Specially, when a fixed resistor is connected externally to the memory device, it is difficult to properly achieve the resistance matching because a resistance of the termination resistor in the memory device could be changed due to several factors such as aging of an integrated circuit (IC), temperature variation or difference in fabrication process. Accordingly, to equalize a total resistance of the termination resistor with external reference resistance, there has been suggested a technology where the resistance of the termination resistor is adjusted by controlling number of transistors to be turned on among a plurality of transistors connected in parallel.

Particularly, in a DDR3 synchronous dynamic random access memory (SDRAM), it is possible to control an on-die-termination (ODT) device to be activated when data are outputted to the outside through a write operation or at a desired time by applying a signal to an external pin.

A latency time taken from an input of an ODT signal applied through the external pin to actual activation/inactivation of a termination resistor is defined as an ODT latency. The ODT latency is classified into an ODT turn-on latency ODTLon and an ODT turn-off latency ODTLoff. The ODT latency is set down through a mode register set (MRS), and has a correlation with a write latency (WL), i.e., ODT latency=WL-2.

Hereinafter, a method of actually adjusting resistance of a termination resistor by applying an external ODT command will be described with reference to the accompanying drawings.

Figure 1:
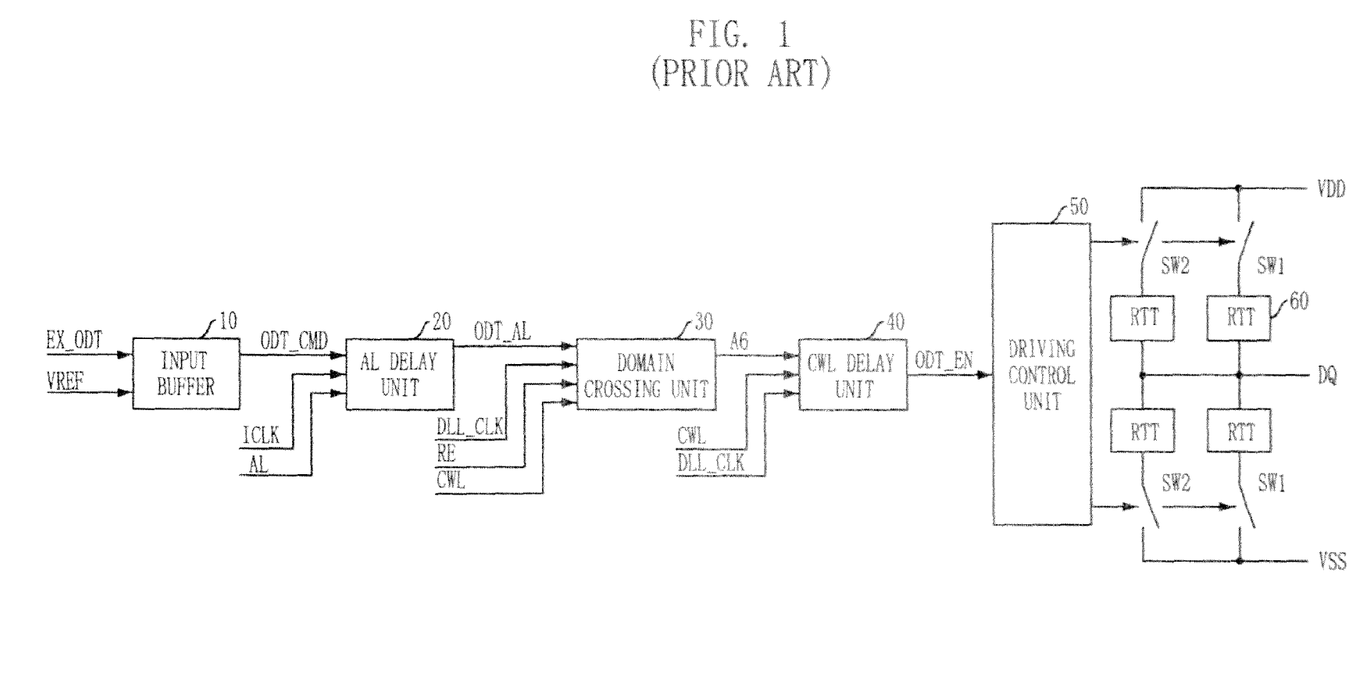
FIG. 1 illustrates a block diagram of a conventional semiconductor memory device having an on-die-termination (ODT) device.

FIG. 1 illustrates a block diagram of a conventional semiconductor memory device having an ODT device.

Referring to FIG. 1, the conventional semiconductor memory device includes an input buffer 10, an additive latency (AL) delay unit 20, a domain crossing unit 30, a column address strobe (CAS) write latency delay unit 40, a driving control unit 50 and a plurality of termination resistors 60. The input buffer unit 10 receives an external ODT command EX_ODT to output an ODT command ODT_CMD. The AL delay unit 20 delays the ODT command ODT_CMD by a delay time corresponding to an additive latency using an internal clock ICLK as a reference clock. The domain crossing unit 30 converts an output signal ODT_AL of the AL delay unit 20 into a delay locked loop (DLL) clock domain signal. The CAS write latency (CWL) delay unit 40 delays a domain crossing signal A6 outputted from the domain crossing unit 30 by a delay time corresponding to the CAS write latency using the DLL clock DLL_CLK as a reference clock to thereby output a driving control signal ODT_EN. The plurality of termination resistors 60 are connected to an output pad in parallel and series. The driving control unit 50 turns on/off switches connected between a supply/ground voltage and the plurality of termination resistors 60 in response to the driving control signal ODT_EN.

Figure 2:
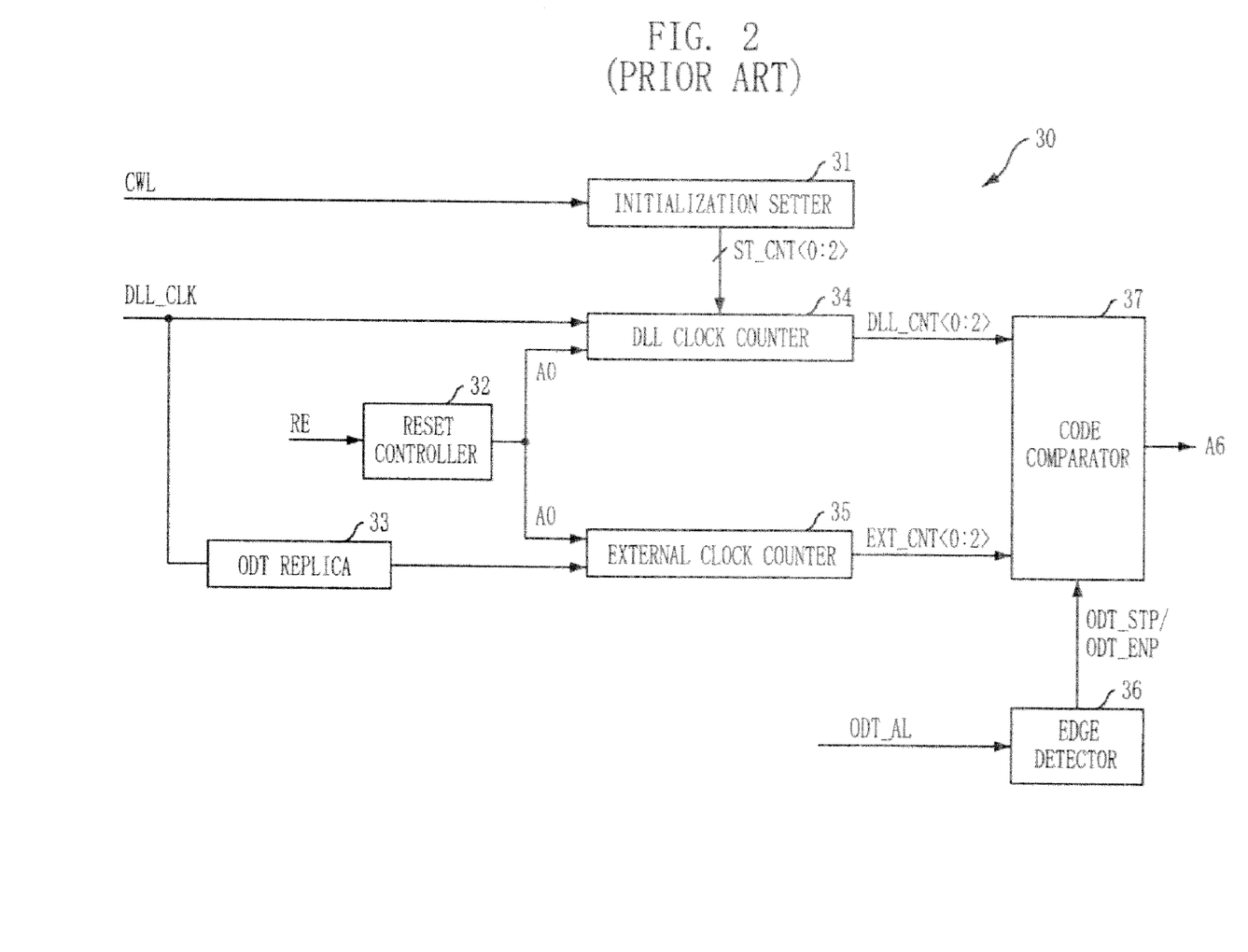
FIG. 2 illustrates a block diagram of a domain crossing unit in the ODT device of FIG. 1.

FIG. 2 illustrates a block diagram of the domain crossing unit 30 in the ODT device of FIG. 1.

Referring to FIG. 2, the domain crossing unit 30 includes a reset controller 32, an initialization setter 31, a DLL clock counter 34, an ODT replica 33, an external clock counter 35, an edge detector 36 and a code comparator 37. The reset controller 32 generates an initialization signal A0 in response to a reset signal RE. The initialization setter 32 outputs an initial set value ST_CNT<0:2> corresponding to a CAS write latency information signal CWL. The DLL clock counter 34 maintains the initial set value ST_CNT<0:2> in response to the initialization signal A0 or counts the DLL clock DLL_CLK to output a DLL counting signal DLL_CNT<0:2>. The ODT replica 33 delays the DLL clock DLL_CLK by a delay time that a semiconductor memory device has. The external clock counter 35 counts an output clock of the ODT replica 33 in response to the initialization signal A0 to output an external clock counting signal EXT_CNT<0:2>. The edge detector 36 detects an edge of the output signal ODT_AL of the AL delay unit 20 to generate a start flag signal ODT_STP and an end flag signal ODT_ENP. The code comparator 37 outputs the domain crossing signal A6 at a point when the external clock counting signal EXT_CNT<0:2> at an activation point of the start flag signal ODT_STP or the end flag signal ODT_ENP is equal to the DLL counting signal DLL_CNT<0:2>.

For reference, the ODT replica 33 is used for compensating for the delay time of the semiconductor memory device, and synchronizing an activation point of the driving control signal ODT_EN with an external clock.

In this way, the conventional semiconductor memory device having the domain crossing unit 30 undergoes a clock domain conversion to synchronize the external ODT command EX_ODT, which is applied in synchronization with an external clock, with the DLL clock DLL_CLK because a turn-on point of the termination resistor can be synchronized with an output point of data only if signals for driving the ODT device should be synchronous with the DLL clock DLL_CLK containing an internal delay of the semiconductor memory device. Further, to adjust an output timing of a high-speed DRAM, the domain crossing unit 30 must operate in such a manner to secure a timing precisely.

The conversion procedure of the clock domain will be more fully described below with reference to a timing diagram.

Figure 3:
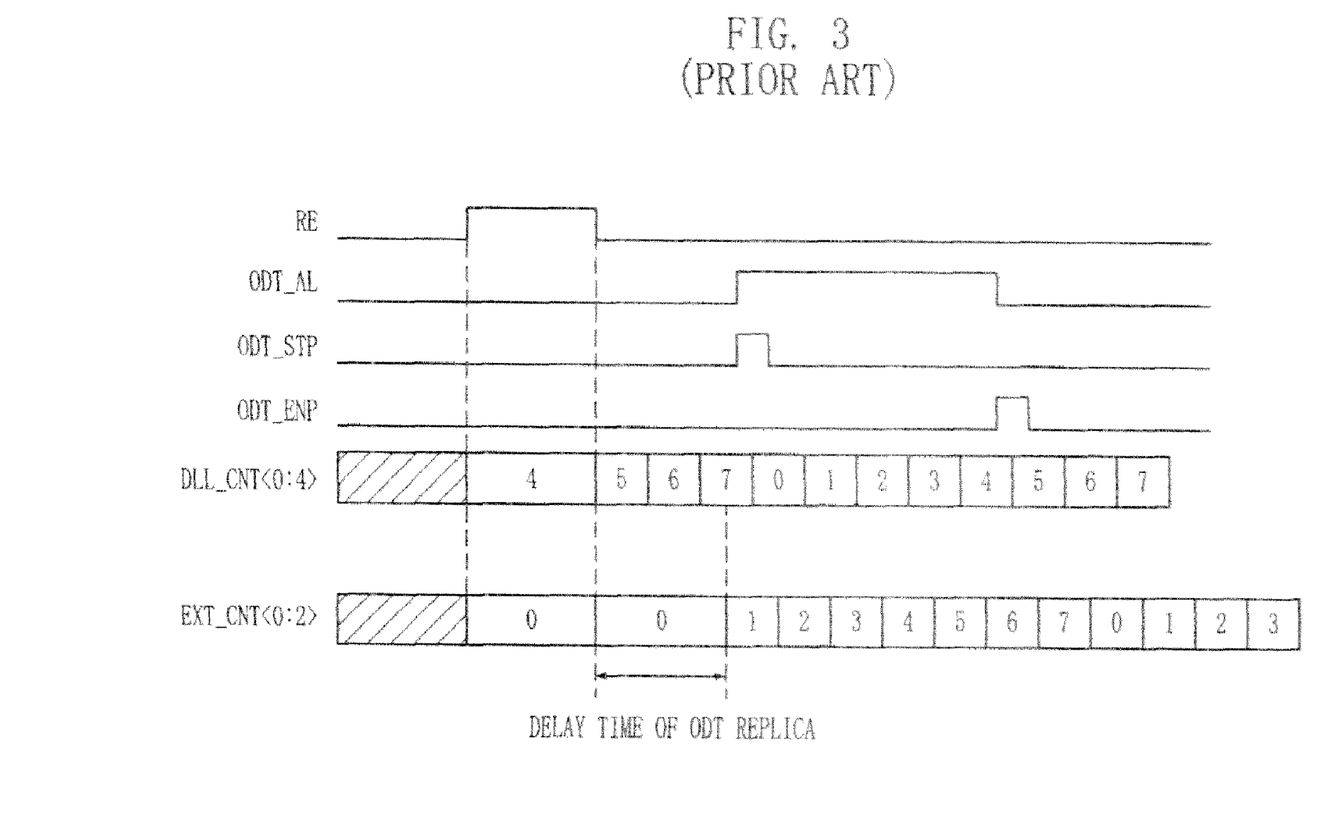
FIG. 3 is a timing diagram illustrating an operation of the domain crossing unit of FIG. 2.

FIG. 3 is a timing diagram illustrating an operation of the domain crossing unit 30 of FIG. 2. An operation of the conventional semiconductor memory device will be illustrated with reference to FIG. 3.

Referring to FIG. 3, the input buffer 10 determines a level of the external ODT command EX_ODT using a reference voltage VREF to thereby output an ODT command ODT_CMD. Thereafter, the AL delay unit 20 delays the ODT command ODT_CMD by a delay time corresponding to the additive latency information signal AL to output the additive ODT signal ODT_AL using the internal clock ICLK as a reference clock.

The reset controller 32 generates the initialization signal A0 in response to the reset signal RE. The initialization setter 31 outputs the initial set value ST_CNT<0:2> corresponding to the CAS write latency information signal CWL.

Subsequently, the DLL clock counter 34 maintains the initial set value ST_CNT<0:2> during the activation of the initialization signal A0. The DLL counting signal DLL_CNT<0:2> is maintained at a value such as a binary code '100' of the initial set value ST_CNT<0:2>. Although not shown, since the DLL clock DLL_CLK is not toggled in response to the reset signal RE but maintained at a constant level, the external clock counter 35 is not enabled.

When the reset signal RE is deactivated, the reset controller 32 deactivates the initialization signal A0 in response to the deactivation of the reset signal RE.

As the initialization signal A0 is deactivated, the DLL clock counter outputs the DLL counting signal DLL_CNT<0:2> by counting the DLL clock DLL_CLK. The DLL counting signal DLL_CNT<0:2> increases according to the DLL clock DLL_CLK. Because the start point corresponds to the initial set value ST_CNT<0:2> as described above, the DLL clock counter 34 starts counting the DLL clock DLL_CLK from 5, i.e., a binary code '101', as a decimal code when the DLL clock DLL_CLK is toggling. The ODT replica 33 delays the DLL clock DLL_CLK by an internal delay time of the semiconductor memory device.

Thereafter, the external clock counter 35 counts the output clock of the ODT replica 33 to increase the external clock counting signal EXT_CNT<0:2>. The counting of the external clock counter 35 always starts from '0' of the decimal code.

The edge detector 36 generates the pulse type start flag signal ODT_STP in response to a rising edge of the additive ODT signal ODT_AL.

The code comparator 37 latches the external clock counting signal EXT_CNT<0:2> at the activation point of the start flag signal ODT_STP. As shown in FIG. 3, it is assumed that the external clock counting signal EXT_CNT<0:2> at this time point is 1 as the decimal code. The code comparator 37 keeps on comparing the latched external clock counting signal EXT_CNT<0:2> with the DLL counting signal DLL_CNT<0:2>, and thus activates the domain crossing signal A6 when the latched external clock counting signal EXT_CNT<0:2> and the DLL counting signal DLL_CNT<0:2> are equal to each other. In this case, the domain crossing signal A6 is activated when DLL counting signal DLL_CNT<0:2>_becomes 1 as the decimal code. That is, the code comparator 37 latches an input point of an external signal using the external clock as a reference clock, and then outputs the domain crossing signal A6 at the point for compensating for a delay of the semiconductor memory device by comparing the external clock and the DLL clock. Consequently, the conversion of the external signal into the DLL clock domain is achieved.

As such, the domain crossing unit 30 synchronizes the additive ODT signal ODT_AL with the DLL clock DLL_CLK to output the domain crossing signal A6.

The CWL delay unit 40 delays the domain crossing signal A6 by a delay time corresponding to the CAS write latency information signal CWL using the DLL clock DLL_CLK as a reference clock.

Because the driving control unit 50 turns on/off switches SW connected to the plurality of termination resistors 60 in response to the output signal ODT_EN of the CWL delay unit 40, the plurality of termination resistors 60 are selectively connected to the supply/ground voltage VDD/VSS, thus achieving impedance matching.

The conventional semiconductor memory device also undergoes the same procedure as described above even though the external ODT command EX_ODT is deactivated, thereby controlling all of the switches to be turned off. The edge detector 36 detects a falling edge of the additive ODT signal ODT_AL to generate a pulse type end flag signal ODT_ENP. The code comparator 37 latches the external clock counting signal EXT_CNT<0:2> in response to the end flag signal ODT_ENB to compare the latched external clock counting signal EXT_CNT<0:2> with the DLL counting signal DLL_CNT<0:2>. A subsequent procedure is identical to the above procedure, and hence further detailed description for it will be omitted herein.

In the above-described procedure, the conversion of signals into the DLL clock domain will be described in more detail again. For clock domain conversion, data is latched when the start flag signal ODT_STP or the end flag signal ODT_ENP is activated on the basis of the external clock. Herein, the external clock counting signal is latched in response to the start flag signal or the end flag signal. The latched external clock counting value is continuously compared with the DLL clock counting signal. Then, if the latched external clock counting value is equal to the DLL clock counting signal, the domain crossing signal A6 is activated. Through this procedure, the conversion of the clock domain is achieved to synchronize a signal, which was synchronized with the external clock, with the DLL clock.

To precisely latch the external clock counting signal EXT_CNT<0:2> at the activation point of the start flag signal ODT_STP or the end flag signal ODT_ENP, the start flag signal ODT_STP or the end flag signal ODT_ENP must be stably positioned within a time interval (hereinafter, referred to as a 'counting window') that one external clock counting signal EXT_CNT<0:2> occupies.

To this end, the output clock of the ODT replica has an optimized delay time by making a replica of the external clock, and thus the ODT replica 33 adjusts the start flag signal and the end flag signal to be positioned within the counting window of the external clock counting signal.

According to the conventional art, however, the start flag signal or the end flag signal may not be positioned within the counting window due to PVT (process, voltage and temperature) variations even though the ODT replica is designed to have the optimized delay time, thus leading to such a malfunction that the terminal resistor is not turned on/off at a time point set by standard specification.

Moreover, because a DDR3 DRAM actually supports an operating speed of 800 Mbps, 1,066 Mbps, 1,333 Mbps, 1,600 Mbps, etc., the procedure of adjusting the delay time of the ODT replica frequently occurs so as to secure an ODT latency at various operating speeds.

SUMMARY OF THE INVENTION

Embodiments of the present invention are directed to providing a semiconductor memory device capable of stably securing an on-die-termination (ODT) latency in spite of PVT variations and various operating speeds.

In one embodiment, a semiconductor memory device includes a plurality of termination resistors connected to an output pad in series and parallel, a drive controller configured to activate/inactivate the plurality of termination resistors in response to a driving control signal, a delay path configured to delay a termination command by a delay time corresponding to an on-die-termination (ODT) latency to output the driving control signal, and configured to convert the termination command into a delay locked loop (DLL) clock domain signal, and a delay control signal generator configured to control a conversion point of the termination command into the DLL clock domain signal.

In another embodiment, a semiconductor memory device includes an input buffer configured to receive an external termination command to output a termination command, a first delay unit configured to delay the termination command by a delay time corresponding to an additive latency to output an additive on-die-termination (ODT) signal using an internal clock as a reference clock, a delay control signal generator configured to selectively receive first and second test signals to generate a delay increase signal and a delay decrease signal in response to a fuse option, a domain crossing unit configured to adjust a conversion point of the additive ODT signal into a DLL clock domain signal to output a domain crossing signal in response to the delay increase signal and the delay decrease signal, a second delay unit configured to delay the domain crossing signal by a delay time corresponding to a column address strobe (CAS) write latency to output a driving control signal using a DLL clock as a reference clock, a plurality of termination resistors connected to an output pad in series and parallel, and a drive controller configured to control the plurality of termination resistors to be connected/disconnected to an output pad in response to the driving control signal.

In further embodiment, a method for driving a semiconductor memory device includes generating a delay control signal to adjust a conversion point into a DLL clock domain, generating a driving control signal by delaying a termination driving command by a delay time corresponding to an ODT latency, wherein the driving control signal is converted into the DLL clock domain signal at the conversion point adjusted by the delay control signal, and switching termination resistors to be connected/disconnected to an output pad in response to the driving control signal.

In still embodiment, a method for driving a semiconductor memory device includes selectively receiving first and second test signals to generate a delay increase signal and a delay decrease signal in response to a fuse option, performing a domain crossing to output a domain crossing signal by adjusting a conversion point of an additive ODT signal synchronized with an external clock into a DLL clock domain signal in response to the delay increase signal and the delay decrease signal, delaying the domain crossing signal by a delay time corresponding to a column address strobe (CAS) write latency to output a driving control signal using a DLL clock as a reference clock, and switching termination resistors to be connected/disconnected to an output pad in response to the driving control signal.

DESCRIPTION OF SPECIFIC EMBODIMENTS

Hereinafter, a semiconductor memory device having an on-die-termination (ODT) device and an operation method thereof in accordance with the present invention will be described in detail with reference to the accompanying drawings.

Figure 4:
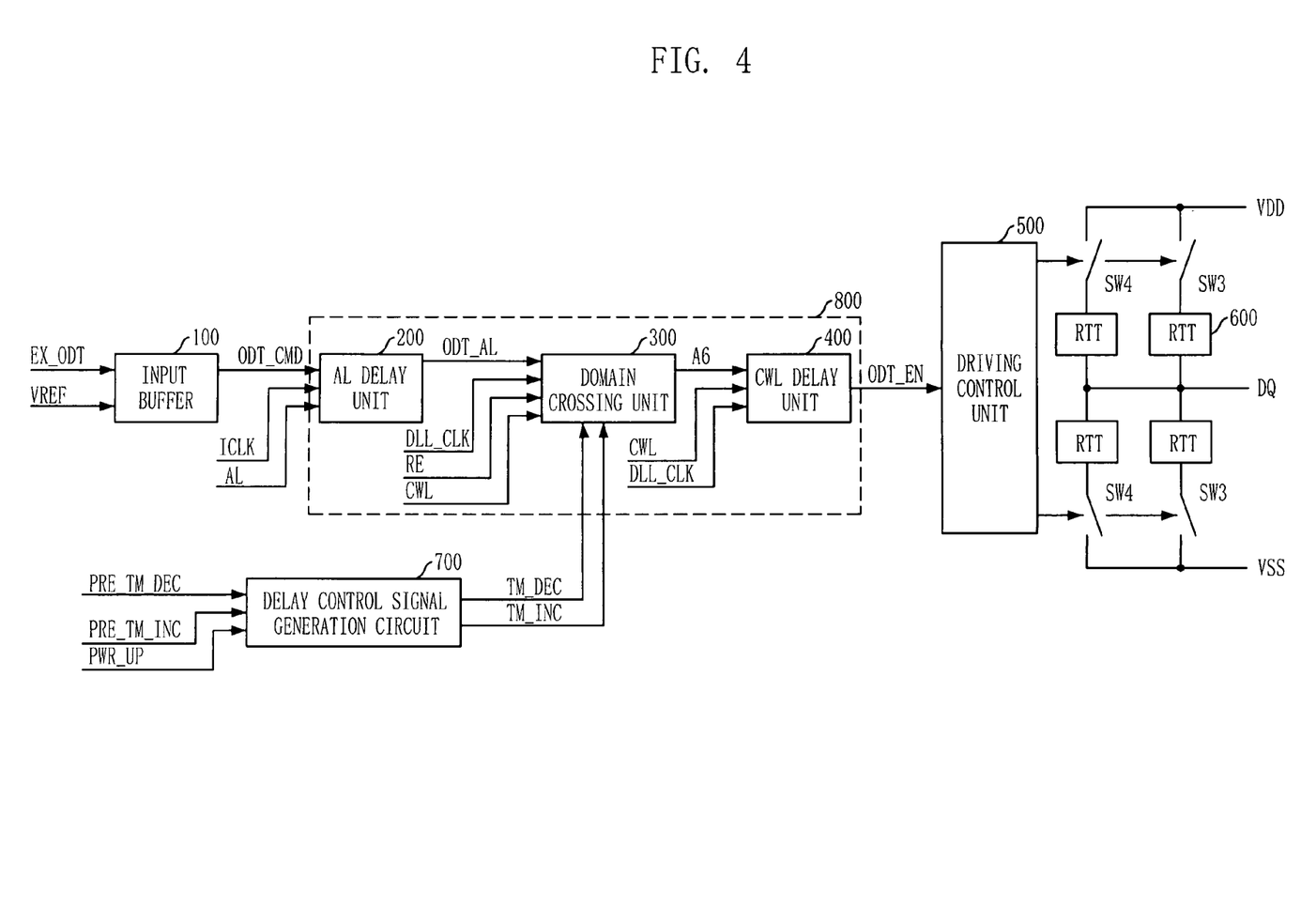
FIG. 4 illustrates a block diagram of a semiconductor memory device having an ODT device in accordance with an embodiment of the present invention.

FIG. 4 illustrates a block diagram of a semiconductor memory device having an ODT device in accordance with an embodiment of the present invention.

Referring to FIG. 4, the semiconductor memory device in accordance with the present invention includes an input buffer 100, a delay path unit 800, a delay control signal generation unit 700, a plurality of termination resistors 600 and switches SW, and a driving control unit 500. The input buffer 100 is configured to receive an external ODT command EX_ODT to output an ODT command ODT_CMD. The delay path unit 800 is configured to delay the ODT command ODT_CMD by a predetermined delay time corresponding to an ODT latency to output a driving control signal ODT_EN, and configured to convert the ODT command ODT_CMD into a DLL clock domain signal. The delay control signal generation unit 700 is configured to control a conversion point to the DLL clock domain. The plurality of termination resistors 600 are connected to an output pad in series and parallel. The switches SW are connected between a supply/ground voltage and the plurality of termination resistors 600 respectively. The driving control unit 500 is configured to turn on/off the switches SW in response to the driving control signal ODT_EN.

The delay path unit 800 includes an additive latency (AL) delay unit 200, a domain crossing unit 300 and a CWL delay unit 400. The AL delay unit 200 is configured to delay the ODT command ODT_CMD by a predetermined delay time corresponding to an additive latency using an internal clock ICLK as a reference clock, thereby outputting an additive ODT signal ODT_AL. The domain crossing unit 300 is configured to be responsive to a delay increase signal TM_INC and a delay decrease signal TM_DEC to adjust a conversion point of the additive ODT signal ODT_AL into a DLL clock domain signal, thereby outputting a domain crossing signal A6. The CWL delay unit 400 is configured to delay the domain crossing signal A6 by a delay time corresponding to a CAS write latency CWL using the DLL clock DLL_CLK as a reference clock to thereby output the driving control signal ODT_EN.

The delay control signal generation unit 700 is configured to receive first and second test signals PRE_TM_DEC and PRE_TM_INC during a test mode to generate the delay increase signal TM_INC and the delay decrease signal TM_DEC for controlling the conversion point to the DLL clock domain. In addition, the delay control signal generation unit 700 can also fix the delay increase signal TM_INC and the delay decrease signal TM_DEC to constant levels using such a fuse option.

In this way, the ODT device in accordance with the present invention including the delay control signal generation unit 700 and the domain crossing unit 300 can adjust the conversion point of the external ODT signal EXT_ODT into the DLL clock domain signal by receiving the first and second test signals PRE_TM_DEC and PRE_TM_INC during the test mode or by a fuse option. That is, the conversion point to the DLL clock domain can be changed when a driving speed or PVT condition is varied in the semiconductor memory device, thus achieving stable domain crossing, which will be more fully described with reference to a block diagram below.

Figure 5:
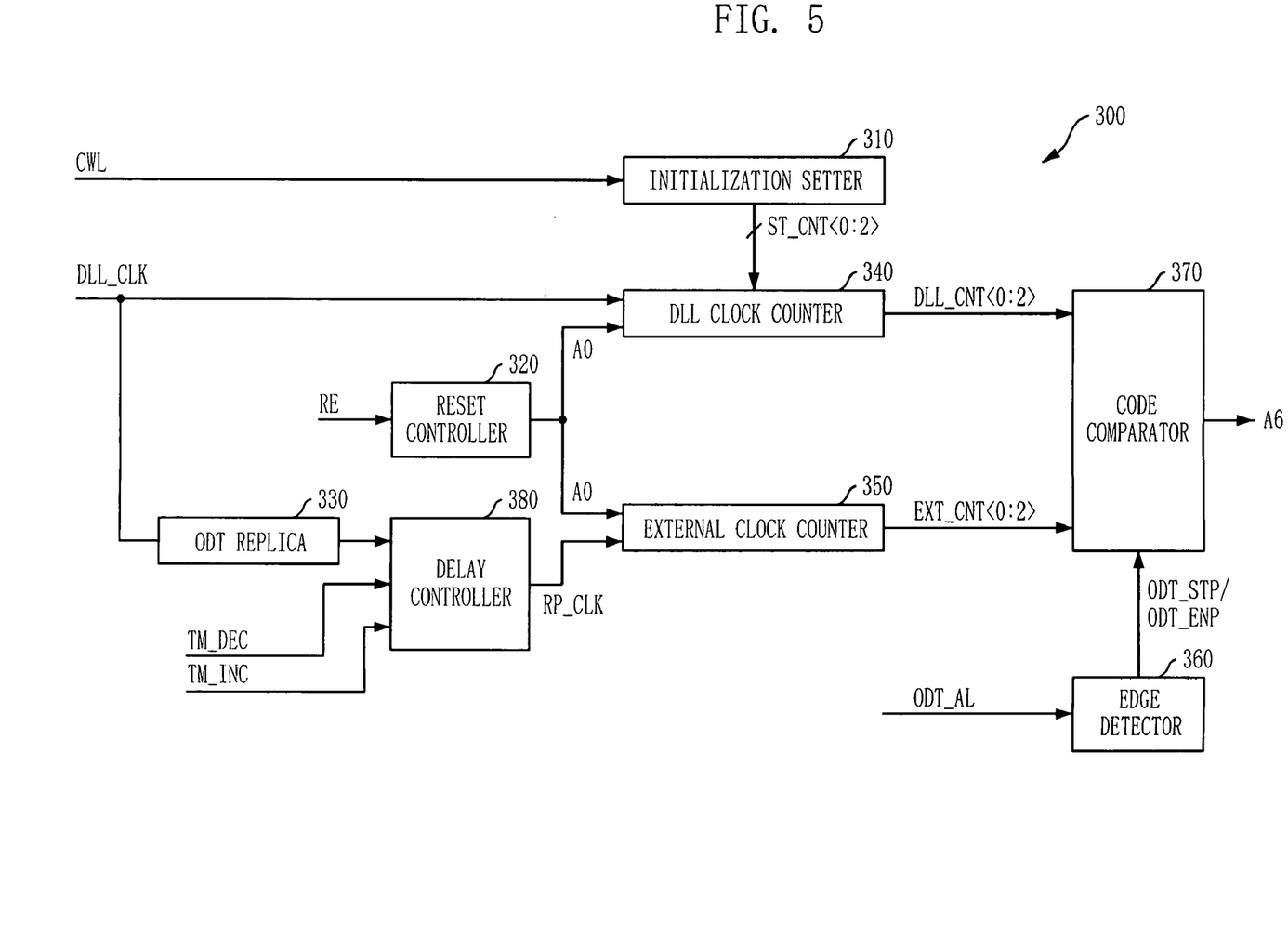
FIG. 5 illustrates a block diagram of a domain crossing unit in the ODT device of FIG. 4.

FIG. 5 illustrates a block diagram of the domain crossing unit 300 in the ODT device of FIG. 4.

Referring to FIG. 5, the domain crossing unit 300 includes a reset controller 320, an initialization setter 310, a DLL clock counter 340, an ODT replica 330, a delay controller 380, an external clock counter 350, an edge detector 360 and a code comparator 370. The reset controller 320 is configured to generate an initialization signal A0 in response to a reset signal RE. The initialization setter 310 is configured to output an initial set value ST_CNT<0:2> corresponding to a CAS write latency information signal CWL. The DLL clock counter 34 is configured to maintain the initial set value ST_CNT<0:2> in response to the initialization signal A0 or to output a DLL counting signal DLL_CNT<0:2> by counting the DLL clock DL_CLK. The ODT replica 330 is configured to delay the DLL clock DLL_CLK by a delay time of a semiconductor memory device. The delay controller 380 is configured to delay the output clock of the ODT replica 330 by a predetermined delay time depending on the delay increase signal TM_INC and the delay decrease signal TM_DEC, thereby outputting a replica external clock RP_CLK. The external clock counter 350 is configured to be responsive to the initialization signal A0 to output an external clock counting signal EXT_CNT<0:2> by counting the replica external clock RP_CLK. The edge detector 360 is configured to detect an edge of the additive ODT signal ODT_AL to generate a start flag signal ODT_STP and an end flag signal ODT_ENP. The code comparator 370 is configured to output the domain crossing signal A6 when the external clock counting signal EXT_CNT<0:2> at the activation point of the start flag signal ODT_STP or the end flag signal ODT_ENP is equal to the DLL counting signal DLL_CNT<0:2>.

For reference, the sequence of the delay controller 380 and the ODT replica 330 may be interchanged. Even in this case, it is also possible to obtain the same effect. Specifically, the delay controller 380 delays the DLL clock DLL_CLK by a predetermined delay time in response to the delay increase signal TM_INC and the delay decrease signal TM_DEC. The ODT replica 330 delays the output clock of the delay controller 380 by a delay time of the semiconductor memory device. The external clock counter 340 outputs the external clock counting signal EXT_CNT<0:2> by counting the output clock of the ODT replica 330.

As described above, the ODT device in accordance with the present invention further includes the delay control signal generation unit 700 and the delay controller 380 in comparison with the conventional ODT device of FIGS. 1 and 2. Therefore, it is possible to stably latch a counting value even though the activation point of the DLL clock DLL_CLK is changed due to PVT variations or change in operating speed.

That is, the activation point of the replica external clock RP_CLK can be advanced or delayed by a predetermined time through the delay controller 380. Therefore, even if PVT condition or operating speed is varied, it is possible to compensate for it. Further, it is possible to control the start flag signal or the end flag signal to be stably positioned within a counting window of the external clock counting signal EXT_CNT<0:2> generated by counting the replica external clock RP_CLK, which will be more fully described below with reference to the accompanying drawings.

Figure 6:
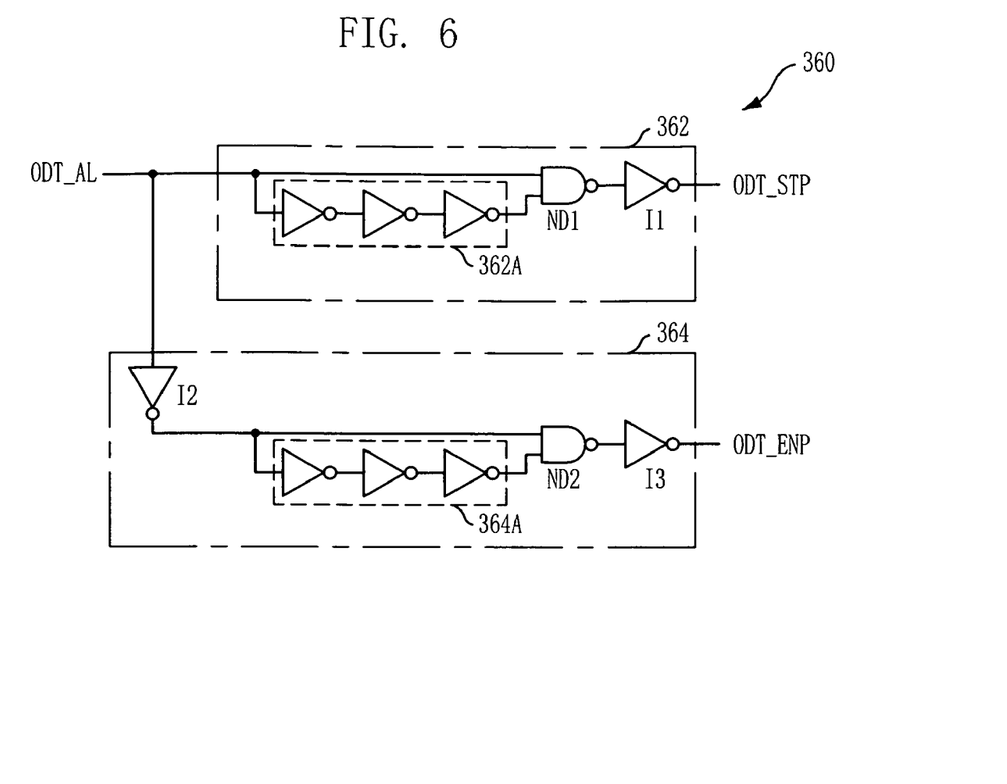
FIG. 6 illustrates a schematic circuit diagram of an edge detector in the domain crossing unit of FIG. 5.

FIG. 6 illustrates a schematic circuit diagram of the edge detector 360 in the domain crossing unit 300 of FIG. 5.

Referring to FIG. 6, the edge detector 360 includes a rising edge detector 362 and a falling edge detector 364. The rising edge detector 362 is configured to detect a rising edge of the additive ODT signal ODT_AL to generate the start flag signal ODT_STP. The falling edge detector 364 is configured to detect a falling edge of the additive ODT signal ODT_AL to generate the end flag signal ODT_STP.

The rising edge detector 362 includes a first inversion delay unit 362A configured to invert and delay the additive ODT signal ODT_AL, a first NAND gate ND1 configured to perform a NAND operation on an output signal of the first inversion delay unit 362A and the additive ODT signal ODT_AL, and a first inverter I1 configured to invert the output signal of the first NAND gate N1 to output the start flag signal ODT_STP.

The falling edge detector 364 includes a second inverter I2 configured to invert the additive ODT signal ODT_AL, a second inversion delay unit 364A configured to invert and delay an output signal of the second inverter I2, a second NAND gate ND2 configured to perform a NAND operation on an output signal of the second inversion delay unit 364A and the output signal of the second inverter I2, and a third inverter I3 configured to invert an output signal of the second NAND gate ND2 to output the end flag signal ODT_ENP.

Figure 7:
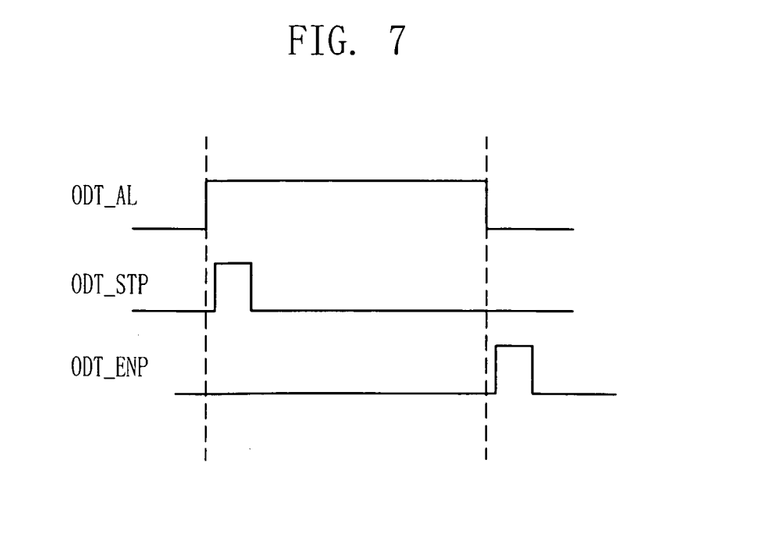
FIG. 7 is a timing diagram illustrating an operation of the edge detector of FIG. 6.

FIG. 7 is a timing diagram illustrating an operation of the edge detector 360 of FIG. 6.

When the additive ODT signal ODT_AL is activated to a logic high level, the rising edge detector 362 detects the rising edge of the additive ODT signal ODT_AL to generate the start flag signal ODT_STP of which a pulse width corresponds to a delay amount of the first inversion delay unit 362A.

When the additive ODT signal ODT_AL is deactivated to a logic low level, the falling edge detector 364 detects the falling edge of the additive ODT signal ODT_AL to generate the end flag signal ODT_ENP of which a pulse width corresponds to a delay amount of the second inversion delay unit 364A.

For reference, the activation pulse widths of the start flag signal ODT_STP and the end flag signal ODT_ENP may be controlled through the delay amount of the inversion delay units 362a and 364a, respectively.

Figure 8:
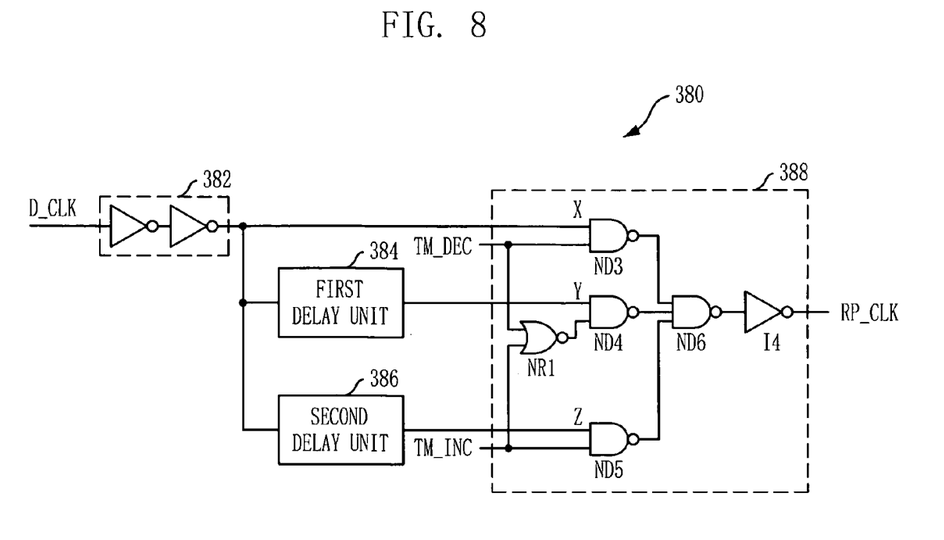
FIG. 8 illustrates a schematic circuit diagram of a delay controller in the domain crossing unit of FIG. 5.

FIG. 8 illustrates a schematic circuit diagram of the delay controller 380 in the domain crossing unit 300 of FIG. 5.

Referring to FIG. 8, the delay controller 380 includes an inverter chain 382, a first delay unit 384, a second delay unit 386 and a selection/output component 388. The inverter chain 382 is configured to delay an output clock D_CLK of the ODT replica 330. The first delay unit 384 is configured to delay the output signal of the inverter chain 382 by a first delay time. The second delay unit 386 is configured to delay the output signal of the inverter chain 382 by a second delay time which is longer than the first delay time. The selection/output component 388 is configured to select one of the output signals of the inverter chain 382, the first delay unit 384 and the second delay unit 386 in response to the delay increase signal TM_INC and the delay decrease signal TM_DEC, and thus to output the replica external clock RP_CLK.

The selection/output component 388 includes NAND gates ND3, ND4, ND5 and ND5, a NOR gate NR1, and an inverter I4. The first NAND gate ND3 is configured to perform a NAND operation on the output signal X of the inverter chain 382 and the delay decrease signal TM_DEC. The NOR gate NR1 is configured to perform a NOR operation on the delay increase signal TM_INC and the delay decrease signal TM_DEC. The second NAND gate ND4 is configured to perform a NAND operation on the output signal of the NOR gate NR1 and the output signal Y of the first delay unit 384. The third NAND gate ND5 is configured to perform a NAND operation on the output signal Z of the second delay unit 386 and the delay increase signal TM_INC. The fourth NAND gate ND6 is configured to perform a NAND operation on the output signals of the NAND gates ND3, ND4 and ND5. The inverter I4 is configured to invert the output signal of the fourth NAND gate ND6 to output the replica external clock RP_CLK.

An operation of the delay controller 380 will be described below.

For example, description will be set forth upon the case where the delay controller 380 delays the output clock D_CLK of the ODT replica 330 by a delay amount set as a default.

In this case, both the delay increase signal TM_INC and the delay decrease signal TM_DEC have logic low levels. Therefore, the signal Y via the inverter chain 382 and the first delay unit 384 is selected by the output signal of the NOR gate NR1 receiving the delay increase signal TM_INC and the delay decrease signal TM_DEC, and the signal Y is then outputted as the replica external clock RP_CLK.

Alternatively, the case where the output clock D_CLK of the ODT replica 330 is delayed by a delay amount smaller than the default will be described. In this case, the delay decrease signal TM_DEC has a logic high level but the delay increase signal TM_INC has a logic low level. Therefore, the output signal X of the inverter chain 382 is selected by the first NAND gate ND3 receiving the delay decrease signal TM_DEC, and the signal X is then outputted as the replica external clock RP_CLK. That is, because the signal X does not pass through the first delay unit 384 unlike the default delay, the delay amount can be reduced by the delay amount of the first delay unit 384.

Alternatively, description will be set forth upon the case where the output clock D_CLK of the ODT replica 330 is delayed by a delay amount greater than the default. In this case, the delay increase signal TM_INC has a logic high level but the delay decrease signal TM_DEC has a logic low level. Therefore, the signal Z via the inverter chain 382 and the second delay unit 386 is selected by the third NAND gate ND5 receiving the delay increase signal TM_INC, and the signal Z is then outputted as the replica external clock RP_CLK. That is, the second delay unit 386 has a delay amount greater than the first delay unit 384, thus outputting the signal Z of which a delay is longer than the default.

Therefore, the replica external clock RP_CLK may have the delay amount equal to the default or have the delay amount smaller or greater than the default depending on the delay increase signal TM_INC and the delay decrease signal TM_DEC. Consequently, it is possible to minutely adjust the activation point of the replica external clock RP_CLK through the delay increase signal TM_INC and the delay decrease signal TM_DEC.

Figure 9:
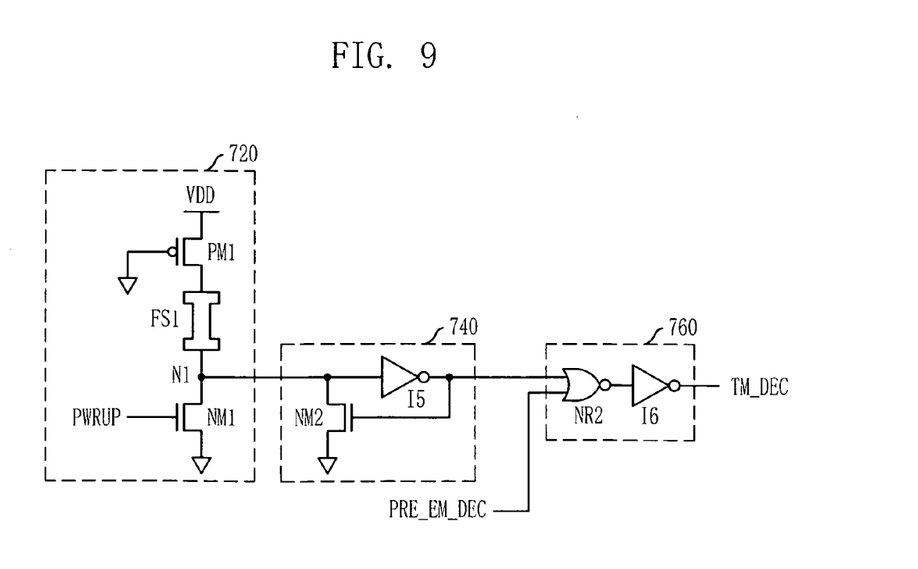
FIG. 9 illustrates a schematic circuit diagram of a delay control signal generator in the ODT device of FIG. 4.

FIG. 9 illustrates a schematic circuit diagram illustrating the delay control signal generation unit 700 in the ODT device of FIG. 4. For reference, though the delay control signal generation unit 700 includes generation units for generating the delay decrease signal TM_DEC and the delay increase signal TM_INC, respectively, each of the generation units has the same circuit configuration and thus only the generation unit of the delay decrease signal TM_DEC will be exemplarily illustrated below.

Referring to FIG. 9, the generation unit of the delay decrease signal TM_DEC includes a fuse sensor 720 configured to sense a fuse option FS1, a fuse signal output unit 740 configured to sense and invert a level of the output signal of the fuse sensor 720, and a signal generator 760 configured to generate the delay decrease signal TM_DEC in response to an output signal of the fuse signal output unit 740 or the first test signal PRE_TM_DEC.

The fuse sensor 720 includes a PMOS transistor PM1, a fuse option FS1 and a first NMOS transistor NM1, and outputs a voltage of an output node N1. The PMOS transistor PM1 receives a ground voltage VSS through a gate thereof and a source terminal of the PMOS transistor PM1 is connected to a power supply terminal VDD. The fuse option FS1 is connected between a drain terminal of the PMOS transistor PM1 and an output node N1. The first NMOS transistor NM1 receives a power-up signal PWRUP through a gate thereof and has a drain-source path between the output node N1 and a ground voltage supply terminal VSS.

The fuse signal output unit 740 includes a first inverter I5 configured to invert the output signal of the fuse sensor 720 and a second NMOS transistor NM2 configured to receive the output signal of the first inverter I5 through a gate thereof and have a drain-source path between the output node N1 of the fuse sensor 720 and the ground voltage supply terminal VSS.

The signal generator 760 includes a NOR gate NR2 configured to perform a NOR operation on the output signal of the fuse signal output unit 740 and the first test signal PRE_TM_DEC, and a second inverter I6 configured to invert the output signal of the NOR gate NR2 to output the delay decrease signal TM_DEC.

An operation of the delay control signal generation unit 700 will be described below.

When power is supplied at an initial operation stage of a DRAM, the power-up signal PWRUP is activated to a logic high level for a predetermined time, thus initializing the fuse sensor 720, the fuse signal output unit 740 and the signal generator 760. That is, the fuse sensor 720 drives the node N1 to a logic low level in response to the power-up signal PWRUP. Thereafter, the fuse signal output unit 740 and the signal generator 760 output the delay decrease signal TM_DEC of logic high level in response to the logic state of the node N1.

When the power-up signal PWRUP is deactivated to a logic low level, the delay decrease signal TM_DEC is generated according to the fuse option FS1 or the logic level of the first test signal PRE_TM_DEC.

The case where the fuse option FS1 is not cut out will be described below.

Since the fuse option FS1 is not cut out, the fuse sensor 720 drives the output node N1 to the power supply voltage VDD. Subsequently, the fuse signal output unit 740 inverts a signal of the output node of the fuse sensor 720 to output the inverted signal of a logic low level. The signal generator 760 generates the delay decrease signal TM_DEC in response to the first test signal PRE_TM_DEC because the output signal of the fuse signal output unit 740 has a logic low level.

In the case where the fuse option FS1 is not cut out, the delay control signal generation unit 700 generates the delay decrease signal TM_DEC according to a logic level of the first test signal PRE_TM_DEC. For example, when the first test signal PRE_TM_DEC has a logic low level, the delay control signal generation unit 700 outputs the delay decrease signal TM_DEC of a logic low level. On the contrary, when the first test signal PRE_TM_DEC has a logic high level, the delay control signal generation unit 700 outputs the delay decrease signal TM_DEC of a logic high level.

Alternatively, the case where the fuse option FS1 is cut out will be described below.

In this case, the output node N1 is being at a floating state because the fuse option FS1 is cut out. The fuse signal output unit 740 inverts a signal of the output node of the fuse sensor 720 to output the inverted signal of a logic high level. Then, the signal generator 760 activates the delay decrease signal TM_DEC to a logic high level because the output signal of the fuse signal output unit 740 has logic high level.

That is, in the case where the fuse option FS1 is cut out, the delay control signal generation unit 720 activates the delay decrease signal TM_DEC to a logic high level irrespective of a logic level of the first test signal PRE_TM_DEC.

Therefore, the delay control signal generation unit 700 activates or deactivates the delay increase signal TM_INC and the delay decrease signal TM_DEC in response to the first and second test signals PRE_TM_DEC and PRE_TM_INC. Thereafter, it is possible to set the delay increase signal TM_INC and the delay decrease signal TM_DEC to have a constant level by cutting the fuse option FS1.

An operation method of the semiconductor memory device in accordance with the present invention shown in FIGS. 4 to 9 will be described below.

The input buffer unit 100 determines a logic level of the external ODT command EX_ODT based on the reference voltage VREF to thereby output the ODT command ODT_CMD.

The AL delay unit 200 delays the ODT command ODT_CMD by a delay time corresponding to the additive latency information signal AL using the internal clock ICLK as a reference clock to thereby output the additive ODT signal ODT_AL.

The delay control signal generation unit 700 generates the delay increase signal TM_INC and the delay decrease signal TM_DEC in response to the first and second test signals PRE_TM_DEC and PRE_TM_INC or the fuse option.

The domain crossing unit 300 is responsive to the delay increase signal TM_INC and the delay decrease signal TM_DEC to adjust a conversion point of the additive ODT signal into the DLL clock domain signal.

The CWL delay unit 400 delays the domain crossing signal A6 of the domain crossing unit 300 by a delay time corresponding to the CAS write latency signal CWL using the DLL clock DLL_CLK as a reference clock.

The driving control unit 500 turns on/off switches connected to the plurality of termination resistors 600 in response to the driving control signal ODT_EN of the CWL delay unit 400.

In this way, the semiconductor memory device in accordance with the present invention connects the termination resistor to the output pad after the lapse of a delay time (ODT latency=WL-2) corresponding to the additive latency and the CAS latency from the activation point of the external ODT command.

In the semiconductor memory device of the present invention, the rising point of the replica external clock is advanced or delayed by applying the first and second test delay signals during a test mode. Once the target rising point of the replica external clock is set through the test mode, the replica external clock is permanently fixed such that it has a constant delay by cutting out the fuse option.

That is, the semiconductor memory device of the present invention can control the replica external clock generated by the ODT replica and the delay controller to have a constant rising point by applying the test signal or cutting out the fuse option even when PVT condition or operation speed of the device is varied.

Therefore, a mask revision is not required to adjust the rising point in the present invention, and thus it is possible to reduce the related cost and test time.

In accordance with the present invention, it is possible to stably perform a clock domain conversion even under various driving speeds and PVT variations through a test mode and a fuse option, thus reducing cost for mask revision and the related test time as well.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a plurality of termination resistors connected to an output pad in series and parallel;
   a drive controller configured to activate/inactivate the plurality of termination resistors in response to a driving control signal;
   a delay path configured to delay a termination command by a delay time corresponding to an on-die-termination (ODT) latency to output the driving control signal, wherein the termination command is converted into a delay locked loop (DLL) clock domain signal; and
   a delay control signal generator configured to control a conversion point of the termination command into the DLL clock domain signal.

2. The semiconductor memory device as recited in claim 1, wherein the ODT latency is equal to a value obtained by subtracting 2 clocks from a sum of an additive latency and a column address strobe (CAS) write latency.

3. The semiconductor memory device as recited in claim 1, wherein the delay path includes:
   a domain crossing unit configured to adjust the conversion point of the termination command into the DLL clock domain signal to output a domain crossing signal in response to a delay increase signal and a delay decrease signal of the delay control signal generator;
   a first delay unit configured to delay the domain crossing signal by a delay time corresponding to the additive latency to output an additive termination signal using a DLL clock as a reference clock; and
   a second delay unit configured to delay the additive termination signal by a delay time corresponding to the CAS write latency to output the driving control signal using the DLL clock as a reference clock.

4. The semiconductor memory device as recited in claim 3, wherein the domain crossing unit includes:
   a reset controller configured to generate an initialization signal in response to a reset signal;
   an initialization setter configured to output an initial set value corresponding to a CAS write latency information signal having information for the CAS write latency;
   a DLL clock counter configured to maintain the initial set value in response to the initialization signal or to output a DLL counting signal by counting the DLL clock;
   an ODT replica configured to delay the DLL clock by a delay time of an ODT device;
   a delay controller configured to delay an output clock of the ODT replica by a predetermined time to output a replica external clock in response to the delay increase signal and the delay decrease signal;
   an external clock counter configured to be responsive to the initialization signal to output an external clock counting signal by counting the replica external clock;

an edge detector configured to detect an edge of the termination command to generate a start flag signal and an end flag signal; and a code comparator configured to output the domain crossing signal at a point when the external clock counting signal at an activation point of the start flag signal or the end flag signal is equal to the DLL counting signal.

5. The semiconductor memory device as recited in claim 4, wherein the delay controller includes:

an inverter chain configured to delay the output clock of the ODT replica;

a first delay unit configured to delay an output signal of the inverter chain;

a second delay unit configured to delay an output signal of the inverter chain; and a selection/output unit configured to select one of output signals of the inverter chain, the first delay unit and the second delay unit in response to the delay increase signal and the delay decrease signal.

6. The semiconductor memory device as recited in claim 3, wherein the domain crossing unit includes:

a reset controller configured to generate an initialization signal in response to a reset signal;

an initialization setter configured to output an initial set value corresponding to a CAS write latency information signal having information for the CAS write latency;

a DLL clock counter configured to maintain the initial set value in response to the initialization signal or to output a DLL counting signal by counting the DLL clock;

a delay controller configured to delay the DLL clock in response to the delay increase signal and the delay decrease signal;

an ODT replica configured to delay an output clock of the delay controller by a delay time of an ODT device to output a replica external clock;

an external clock counter configured to be responsive to the initialization signal to output an external clock counting signal by counting the replica external clock;

an edge detector configured to detect an edge of the termination command to generate a start flag signal and an end flag signal; and a code comparator configured to output the domain crossing signal at a point when the external clock counting signal at an activation point of the start flag signal or the end flag signal is equal to the DLL counting signal.

7. The semiconductor memory device as recited in claim 5, wherein the second delay unit has a delay time longer than the first delay unit.

8. The semiconductor memory device as recited in claim 1, wherein the delay path includes:

a first delay unit configured to delay the termination command by a delay time corresponding to the additive latency to output an additive termination signal using an internal clock as a reference clock;

a second delay unit configured to delay the additive termination signal by a delay time corresponding to the CAS write latency to output a CAS termination signal using the internal clock as a reference clock; and a domain crossing unit configured to control the conversion point of the CAS termination command into a DLL clock domain signal to output the driving control signal in response to a delay increase signal and a delay decrease signal of the delay control signal generator.

9. The semiconductor memory device as recited in claim 8, wherein the domain crossing unit includes:

a reset controller configured to generate an initialization signal in response to a reset signal;

an initialization setter configured to output an initial set value corresponding to a CAS write latency information signal having information for the CAS write latency;

a DLL clock counter configured to maintain the initial set value in response to the initialization signal or to output a DLL counting signal by counting a DLL clock;

an ODT replica configured to delay the DLL clock by a delay time of an ODT device;

a delay controller configured to delay an output clock of the ODT replica to output a replica external clock in response to the delay increase signal and the delay decrease signal;

an external clock counter configured to be responsive to the initialization signal to output an external clock counting signal by counting the replica external clock;

an edge detector configured to detect an edge of the CAS termination command to generate a start flag signal and an end flag signal; and a code comparator configured to output the domain crossing signal at a point when the external clock counting signal at an activation point of the start flag signal or the end flag signal is equal to the DLL counting signal.

10. A semiconductor memory device, comprising:

an input buffer configured to receive an external termination command to output a termination command;

a first delay unit configured to delay the termination command by a delay time corresponding to an additive latency to output an additive on-die-termination (ODT) signal using an internal clock as a reference clock;

a delay control signal generator configured to selectively receive first and second test signals to generate a delay increase signal and a delay decrease signal in response to a fuse option;

a domain crossing unit configured to adjust a conversion point of the additive ODT signal into a DLL clock domain signal to output a domain crossing signal in response to the delay increase signal and the delay decrease signal;

a second delay unit configured to delay the domain crossing signal by a delay time corresponding to a column address strobe (CAS) write latency to output a driving control signal using a DLL clock as a reference clock;

a plurality of termination resistors connected to an output pad in series and parallel; and a drive controller configured to control the plurality of termination resistors to be connected/disconnected to an output pad in response to the driving control signal.

11. The semiconductor memory device as recited in claim 10, wherein the domain crossing unit includes:

a reset controller configured to generate an initialization signal in response to a reset signal;

an initialization setter configured to output an initial set value corresponding to a CAS write latency information signal;

a DLL clock counter configured to maintain the initial set value in response to the initialization signal or to output a DLL counting signal by counting the DLL clock;

an ODT replica configured to delay the DLL clock by a delay time of the semiconductor memory device;

a delay controller configured to delay an output clock of the ODT replica by a predetermined delay time to output a replica external clock in response to the delay increase signal and the delay decrease signal;

an external clock counter configured to be responsive to the initialization signal to output an external clock counting signal by counting the replica external clock;

an edge detector configured to detect an edge of the additive ODT signal to generate a start flag signal and an end flag signal; and a code comparator configured to output the domain crossing signal at a point when the external clock counting signal at an activation point of the start flag signal or the end flag signal is equal to the DLL counting signal.

12. The semiconductor memory device as recited in claim 11, wherein the delay controller includes:

an inverter chain configured to delay an output clock of the ODT replica;

a first delay unit configured to delay an output signal of the inverter chain;

a second delay unit configured to delay the output signal of the inverter chain; and a selection/output unit configured to select one of output signals of the inverter chain, the first delay unit and the second delay unit in response to the delay increase signal and the delay decrease signal.

13. The semiconductor memory device as recited in claim 10, wherein the domain crossing unit includes:

a reset controller configured to generate an initialization signal in response to a reset signal;

an initialization setter configured to output an initial set value in response to a CAS write latency information signal;

a DLL clock counter configured to maintain the initial set value in response to the initialization signal or to output a DLL counting signal by counting the DLL clock;

a delay controller configured to delay the DLL clock by a predetermined delay time in response to the delay increase signal and the delay decrease signal;

an ODT replica configured to delay the output clock of the delay controller by a delay time of the semiconductor memory device to output the replica external clock;

an external clock counter configured to be responsive to the initialization signal to output an external clock counting signal by counting the replica external clock;

an edge detector configured to detect an edge of the additive ODT signal to generate a start flag signal and an end flag signal; and a code comparator configured to output the domain crossing signal at a point when the external clock counting signal at an activation point of the start flag signal or the end flag signal is equal to the DLL counting signal.

14. The semiconductor memory device as recited in claim 12, wherein the second delay unit has a delay time longer than the first delay unit.

15. A method for driving a semiconductor memory device, the method comprising:

generating a delay control signal to adjust a conversion point into a DLL clock domain;

generating a driving control signal by delaying a termination driving command by a delay time corresponding to an ODT latency, wherein the driving control signal is converted into the DLL clock domain signal at the conversion point adjusted by the delay control signal; and switching termination resistors to be connected/disconnected to an output pad in response to the driving control signal.

16. The method as recited in claim 15, wherein the ODT latency is equal to a value obtained by subtracting 2 clocks from a sum of an additive latency and a column address strobe (CAS) write latency.

17. The method as recited in claim 15, wherein generating of the driving control signal includes:

performing a domain crossing to output a domain crossing signal by adjusting a conversion point of the termination driving command into the DLL clock domain signal in response to first and second delay control signals;

delaying the domain crossing signal by a delay time corresponding to the additive latency to output an additive signal using a DLL clock as a reference clock; and delaying the additive signal by a delay time corresponding to the CAS write latency to output the driving control signal using the DLL clock as a reference clock.

18. The method as recited in claim 16, wherein the generating of the driving control signal includes:

delaying the termination driving signal by a delay time corresponding to the additive latency to output an additive signal using an internal clock as a reference clock;

delaying the additive signal by a delay time corresponding to the CAS write latency to output a CAS signal using the internal clock as a reference clock; and performing a domain crossing to output the driving control signal by adjusting a conversion point of the CAS signal into the DLL clock domain signal in response to first and second delay control signals.

19. The method as recited in claim 17, wherein performing of the domain crossing includes:

maintaining a DLL counting signal to an initial set value corresponding to the CAS write latency at an initial operation stage, and deactivating the DLL clock;

delaying an activated DLL clock by a delay time of the semiconductor memory device, after the initial operation stage, and outputting a replica external clock by adjusting a rising edge of the delayed DLL clock in response to the first and second delay control signals; and outputting the domain crossing signal when the DLL counting signal obtained by counting the DLL clock is equal to an external clock counting signal obtained by counting the replica external clock at an activation point of the additive signal, after the initial operation stage.

20. A method for driving a semiconductor memory device, the method comprising:

selectively receiving first and second test signals to generate a delay increase signal and a delay decrease signal in response to a fuse option;

performing a domain crossing to output a domain crossing signal by adjusting a conversion point of an additive ODT signal synchronized with an external clock into a DLL clock domain signal in response to the delay increase signal and the delay decrease signal;

delaying the domain crossing signal by a delay time corresponding to a column address strobe (CAS) write latency to output a driving control signal using a DLL clock as a reference clock; and switching termination resistors to be connected/disconnected to an output pad in response to the driving control signal.

21. The method as recited in claim 20, wherein performing of the domain crossing includes:

maintaining a DLL counting signal at an initial set value corresponding to the CAS write latency at an initial operation stage, and deactivating the DLL clock;

delaying an activated DLL clock by a delay time of the semiconductor memory device, after the initial driving stage, and outputting a replica external clock by adjusting a rising edge of the delayed DLL clock in response to the delay increase signal and the delay decrease signal; and outputting the domain crossing signal when the DLL counting signal obtained by counting the DLL clock is equal to an external clock counting signal obtained by counting the replica external clock at an activation point of the additive ODT signal after the initial operation stage.

22. The method as recited in claim 21, wherein outputting of the domain crossing signal includes:
   detecting an edge of the additive ODT signal to generate a start flag signal or an end flag signal;
   counting the DLL clock from the initial set value to increase a value of the DLL clock counting signal;
   counting the replica external clock to output the external clock counting signal; and
   outputting the domain crossing signal at a point when the DLL counting signal is equal to the external clock counting signal at an activation point of the start flag signal or the end flag signal.

23. The method as recited in claim 22, wherein outputting of the replica external clock includes:
   delaying the DLL clock by the delay time of the semiconductor memory device to output the delayed DLL clock; and
   outputting the replica external clock by advancing or delaying a rising point of the delayed DLL clock in response to the delay increase signal and the delay decrease signal.

24. The method as recited in claim 23, further comprising:
   receiving an external ODT command to output an ODT command; and
   delaying the ODT command by a delay time corresponding to the additive latency to output the additive ODT signal using an internal clock as a reference clock.

* * * * *